United States Patent [19]

Yamada et al.

[11] Patent Number: 5,233,316
[45] Date of Patent: Aug. 3, 1993

[54] DIGITAL VOLTAGE CONTROLLED OSCILLATOR HAVING A RING OSCILLATOR WITH SELECTABLE OUTPUT TAPS

[75] Inventors: Takaaki Yamada; Hiroshi Yamagata, both of Kanagawa, Japan

[73] Assignee: Sony Corporation, Tokyo, Japan

[21] Appl. No.: 888,177

[22] Filed: May 26, 1992

[30] Foreign Application Priority Data

May 28, 1991 [JP] Japan .................................. 3-153897

[51] Int. Cl.$^5$ ...................... H03B 27/00; H03L 7/06; H03L 7/099
[52] U.S. Cl. ...................................... 331/45; 331/1 A
[58] Field of Search ................... 331/18, 25, 57, 1 A, 331/78, 34, 45

[56] References Cited

U.S. PATENT DOCUMENTS

| | | | |
|---|---|---|---|
| 4,494,021 | 1/1985 | Bell et al. ........................... | 331/57 X |
| 4,706,040 | 11/1987 | Mehrgardt ......................... | 331/25 X |
| 4,902,986 | 2/1990 | Lesmeister ........................ | 331/57 X |
| 5,068,628 | 11/1991 | Ghoshal ............................ | 331/57 X |
| 5,119,045 | 6/1992 | Sato ................................... | 331/57 X |
| 5,126,691 | 6/1992 | Mijuskovic et al. .............. | 331/1 A |

*Primary Examiner*—David Mis
*Attorney, Agent, or Firm*—Alvin Sinderbrand; William S. Frommer

[57] ABSTRACT

A digital VCO is disclosed which comprises a ring oscillator formed of a plurality of inverters connected in series, each inverter being capable of controlling its delay amount, a frequency controlling circuit for controlling the oscillation frequency of the ring oscillator to coincide with a reference frequency, a selector switch for selecting specified output taps from output taps, each thereof being provided for each of the plurality of inverters, to take out the outputs therefrom, and switching control means for controlling the output taps from which the outputs are taken out to be cyclically switched through the selector switch.

3 Claims, 5 Drawing Sheets

DIGITAL VOLTAGE CONTROLLED OSCILLATOR HAVING A RING OSCILLATOR WITH SELECTABLE OUTPUT TAPS

BACKGROUND OF THE INVENTION

1. Field of the Invention

The present invention relates to a digital VCO and, more particularly, to a digital VCO suitable for use in a digital PLL of which capability of changing the output with a fine phase pitch is required.

2. Description of the Prior Art

Generally, in a digital VCO, the frequency of the original signal is divided down and the thus obtained signal is decoded so that a signal with a required phase is obtained. When generating a signal having a required phase in the described manner, the phase which can be obtained is given, with the frequency of the original signal represented by $f_0$ and the frequency divisor represented by N, by $n\pi/N$ (n=0, 1, ... 2N−1), that is 2N kinds of phases can be obtained. In the conventional VCO, there has been a disadvantage that the greater the frequency divisor N is, the lower the frequency becomes, or the higher the original signal frequency should be. Thus, the clock frequency should be increased in order to decrease the phase pitch of the output signal, and therefore, a VCO of the described type has not been applicable for example to the color subcarrier signal (3.58 MHz) of the video signal (NTSC) in a television receiver. More specifically, when the phase pitch accuracy is to be raised to 1 degree (0.78 nS), a frequency of $1/0.78$ nS $\approx 1.3$ GHz is required. Since a clock signal with such extremely high frequency becomes necessary, the application has been difficult to be realized.

When an oscillator circuit using a quartz oscillator Xtal is used for the VCO in a PLL, since the variable range is as narrow as the accuracy of the center frequency, adjustment of the center frequency becomes necessary. On the other hand, when an LC oscillation circuit is used for the VCO, there is a possibility of the PLL loop producing pseudo lock-in. If the variable range is narrowed in order to avoid that possibility, then the adjustment of the center frequency becomes necessary for the same reason as described above.

OBJECTS AND SUMMARY OF THE INVENTION

An object of the present invention is to provide a digital VCO capable of changing its output with a phase pitch smaller than the phase pitch corresponding to the clock frequency.

The digital VCO of the present invention comprises a ring oscillator formed of a plurality of inverters connected in series, each inverter being capable of controlling its delay amount, a frequency controlling circuit for controlling the oscillation frequency of the ring oscillator to coincide with a reference frequency, a selector switch for selecting specified output taps from output taps, each thereof being provided for each of the plurality of inverters, to take out the outputs therefrom, and switching control means for controlling the output taps from which the outputs are taken out to be cyclically switched through the selector switch.

By structuring a PLL circuit with a ring oscillator used as the VCO and cyclically switching the output taps selected from output taps of the ring oscillator for taking out the outputs therefrom, thereby rotating the phase, it becomes possible to allow the frequency of the signal taken out of the ring oscillator to change finely. Thus, the output with a much smaller phase pitch than the oscillation cycle of the ring oscillator can be obtained.

DESCRIPTION OF THE PREFERRED EMBODIMENTS

Figure 1:
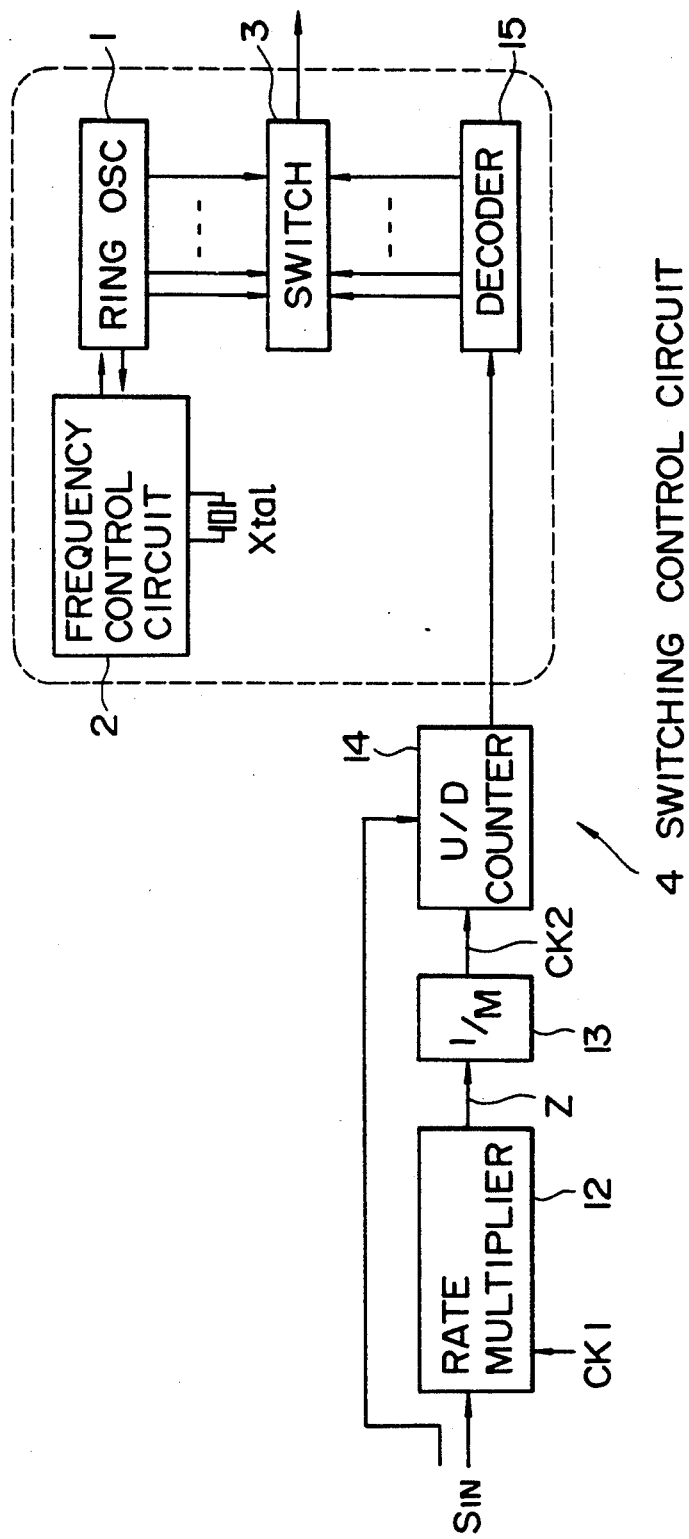
FIG. 1 is a block diagram of a digital VCO as a first embodiment of the present invention.

FIG. 1 shows a block diagram of a digital VCO as a first embodiment of the present invention. As apparent from FIG. 1, the digital VCO of the present embodiment comprises a ring oscillator 1, a ring oscillation controlling PLL 2, a selector switch 3, a switching control circuit 4, etc.

Figure 2:
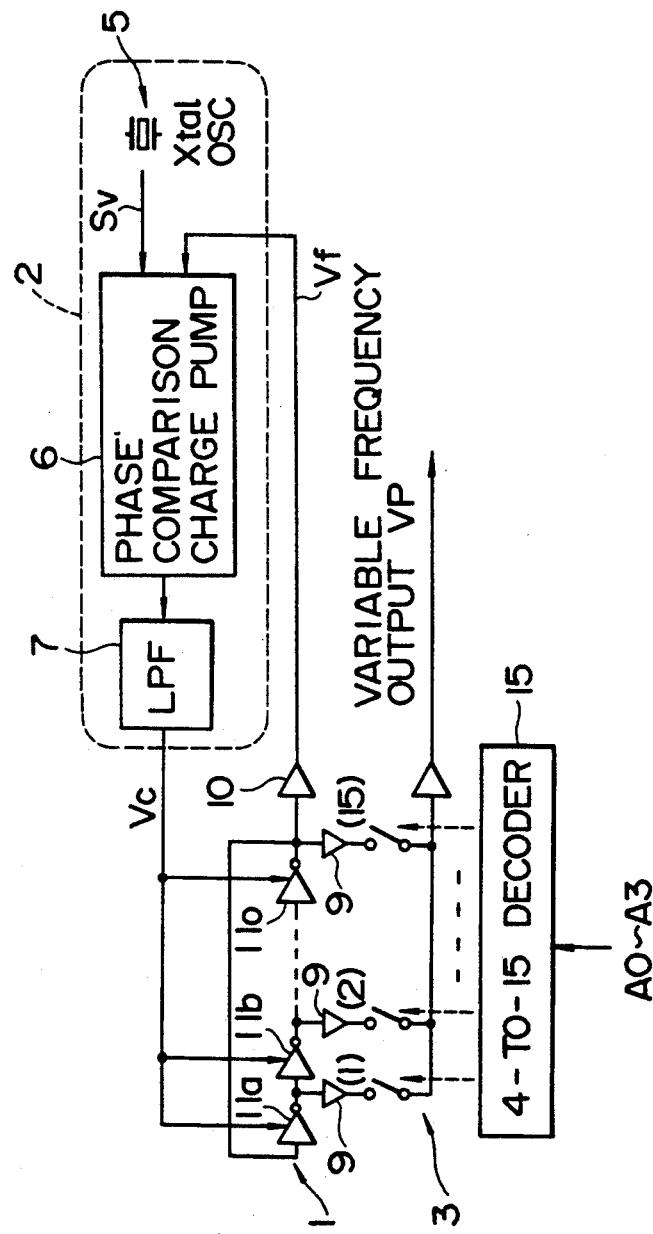
FIG. 2 is a block diagram of a principal portion of the digital VCO of the present invention shown in FIG. 1.

The ring oscillator 1 is provided with 15 steps of output taps (1) to (15) as shown in a block diagram of the principal portion of the digital VCO of FIG. 2. Of the taps (1) to (15), the taps from which the output signal is taken out are adapted to be cyclically switched by the selector switch 3 so that the frequency of the output signal Vp is changed.

The ring oscillation controlling PLL 2 comprises a reference frequency oscillator 5, a phase comparison charge pump 6, a low-pass filter 7, etc. The reference frequency oscillator 5 is formed of a VCO using a quartz oscillator and correctly generates the reference frequency for the ring oscillator 1.

The oscillation output signal Sv of the reference frequency oscillator 5 is supplied to the phase comparison charge pump 6. The phase comparison charge pump 6 is in receipt of a fixed phase output signal Vf of the ring oscillator 1 through a buffer amplifier 10, and in this phase comparison charge pump 6, the oscillation output signal Sv and the fixed phase output signal Vf are composed for phase.

The phase difference between the signals detected by the phase comparison charge pump 6 is supplied to the low-pass filter 7 and, therein, a control voltage Vc is generated. The control voltage Vc is supplied to each of inverter circuits 11a to 11o forming the ring oscillator 1.

The inverter circuits 11a to 11o are each arranged to serve as an inverter for controlling the delay amount depending on the value of the control voltage Vc supplied thereto. Accordingly, even if there is present a phase difference, this can be canceled by means of the control voltage Vc and, thereby, the reference oscillation frequency of the ring oscillator 1 is controlled to be accurately coincident with the oscillation frequency of the reference frequency oscillator 5 using the quartz oscillator. Between each of the output terminals of the inverter circuits 11a to 11o and each of the output taps (1) to (15), there is provided a buffer circuit 9, whereby the output of the ring oscillator is taken out from each of the output taps (1) to (15) through the buffer circuit 9.

The switching control circuit 4 is provided for cyclically switching the taps selected from the output taps (1) to (15) of the ring oscillator 1 to take out the outputs therefrom so that the frequency of the output signal may be changed. In the present embodiment, it is formed of a rate multiplier 12, a frequency divider 13, a U/D counter 14, a decoder 15, etc.

The rate multiplier 12 is a counter in which the ratio of the number of pulses of an output pulse Z to the number of pulses of the input clock pulse CK1 is determined in proportion to a preprogrammed rate input $S_{IN}$. The rate input $S_{IN}$ is given for example in 7 bits. Hence, up to 128 kinds of the output Z can be set up.

The intervals of pulses of the output pulse train of the above described output Z are not always equal by reason of the internal circuit configuration of the rate multiplier 12. In order to equalize the pulse intervals of the output pulse train, the frequency of the clock pulse CK1 is previously multiplied by M and the output Z is arranged to be divided down to 1/M by the frequency divider 13. The clock pulse CK2 undergone the frequency division by M in the frequency divider 13 is supplied to the decoder 15 through the U/D counter 14 which is a modulo-15 counter.

The digital VCO arranged as described above operates in this way. We suppose that the switch for the tap (1) of the 15 output taps (1) to (15) is ON now. At this time, a signal of the same waveform as the waveform of the output terminal (1) appears as the output signal Vp as shown in the operating waveform chart of FIG. 3.

Figure 3:
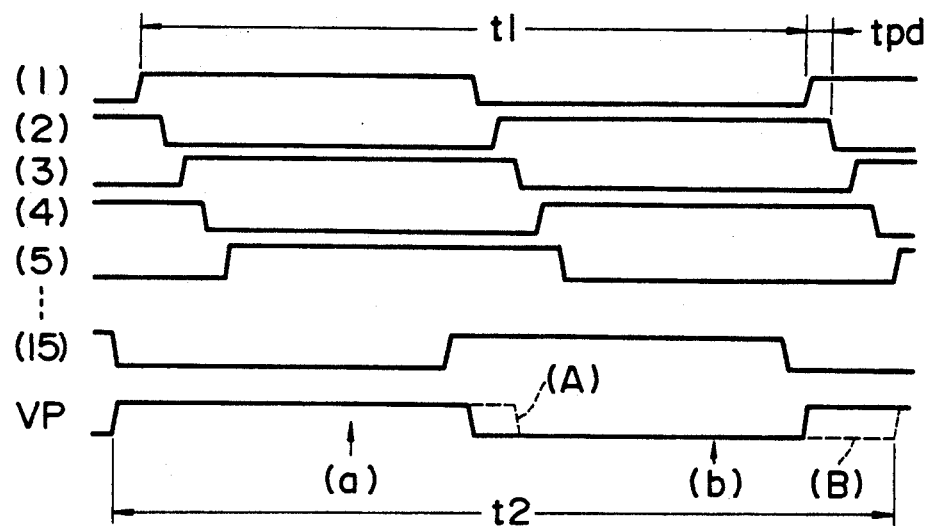
FIG. 3 is a waveform chart showing operation of the circuit of the first embodiment of the invention shown in FIG. 1.

Then, if the output tap (1) is switched to the output tap (3) at the timing (a) indicated in FIG. 3, then, the waveform of the output signal Vp will change to become as indicated by the dotted line (A) in the waveform of the output signal Vp of FIG. 3.

Further, if the output tap is switched from (3) to (5) at the timing (b), then, the waveform will change to become as similarly indicated by the dotted line (B) in the waveform of the output signal Vp of FIG. 3.

By rotating the taps from which the output is taken out as described above, the frequency of the output signal Vp is changed from the frequency 1/t1 at the time before the switch selection was performed to 1/t2, which is lower in frequency than before. The amount of the change in frequency is determined by how frequent the switching is made. When the direction of switching of the taps is reversed, the frequency can be increased.

The above described change in frequency will be described below using numerical expressions. First, the frequency $f_z$ of the output Z of the rate multiplier 12 is given by $$f_z = N/128 \cdot f_{CK1}, \quad (1)$$

where N represents a 7-bit input value and $f_{CK1}$ represents the clock frequency.

Accordingly, the clock frequency $f_{CK2}$ input to the U/D counter 14 will be expressed as $$f_{CK2} = N/128M \cdot f_{CK1}, \quad (2)$$

where M represents the frequency divisor. When the difference in the frequency of the output signal Vp is represented by $\Delta f_{VP}$, the same will be expressed as $$\Delta f_{VP} = N/128M \cdot f_{CK1} \cdot f_{ROSC} \cdot t_{pCH}, \quad (3)$$

where $f_{ROSC}$ represents the oscillation frequency of the ring oscillator 1 and $t_{pCH}$ represents the phase pitch of the VCO, which is a pitch twice as large as the phase difference $t_{pd}$ in FIG. 3. Incidentally, because the ring oscillator 1 is a 15-stage ring oscillator, the phase pitch is given by $$t_{pCH} = 1/(15 \cdot f_{ROSC}). \quad (4)$$

Since $f_{CK1}$, $f_{ROSC}$, $t_{pCH}$, and M are all constants, it is known that the digital VCO of the first embodiment shown in FIG. 1 provides a frequency change in proportion to the input 7-bit value N.

In the configuration of FIG. 1, though the frequency divider 13 is disposed in the stage subsequent to the rate multiplier 12, this order may be reversed to provide the output $f_{CK2}$ of the same frequency. However, since intervals of the output pulses of the rate multiplier 12 are not equal as described above, it is better to arrange the frequency divider 13 to follow the rate multiplier 12 because the degree of the inequality of intervals is thereby remedied.

The digital VCO of the present embodiment is adapted to provide a fine phase pitch through the operation as described above. However, when the digital VCO is actually operated, there arises a problem of the timing of switching as a troublesome problem.

Figure 4:
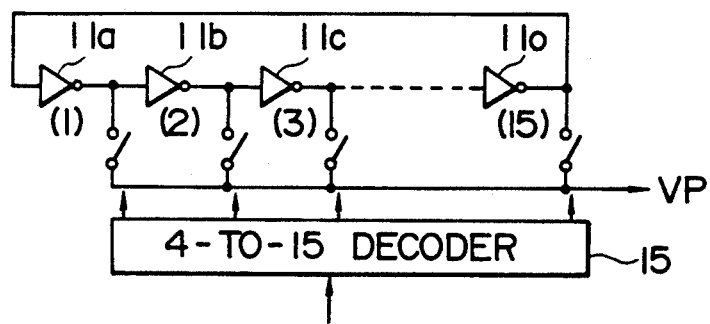
FIG. 4 is a block diagram of a switch portion used in the first embodiment of the invention shown in FIG. 1.
Figure 5:
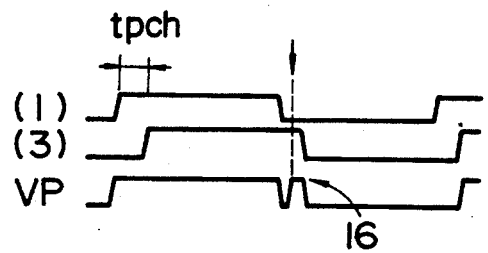
FIG. 5 is an operating waveform chart explanatory of a state in which the phase is delayed in the first embodiment of the invention shown in FIG. 1.

For example, when switching is made in the direction to delay the phase as shown in a block diagram of FIG. 4 and an operating waveform chart of FIG. 5, a spike 16 sometimes appears in the output signal Vp when the output taps are switched from the tap (1) to the tap (3). Existence of such a spike 16 involves a risk of erroneous inversion of the flip-flop constituting a frequency dividing circuit provided in the following stage. It therefore is a serious problem.

Figure 6:
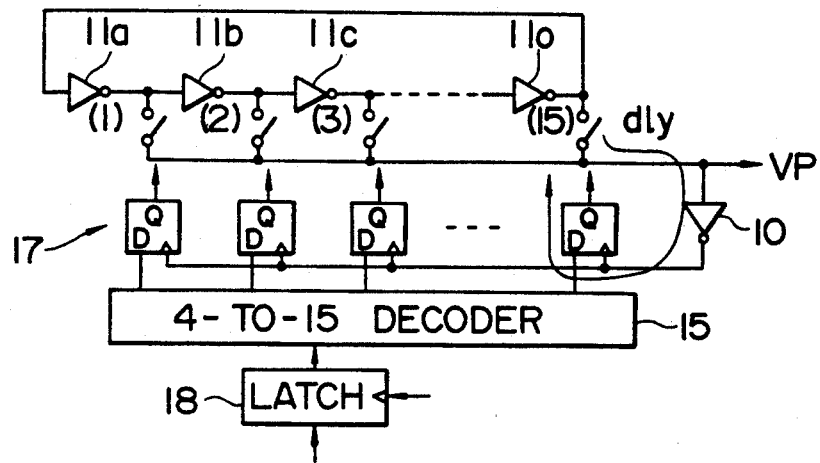
FIG. 6 is a block diagram of a principal portion showing an example in which latch circuits are provided in the first embodiment of the invention shown in FIG. 1.

In order to prevent such a spike 16 from being produced, favorable results are obtained by providing a first latch circuit 17 and a second latch circuit 18 as shown in a block diagram of FIG. 6.

Figure 7:
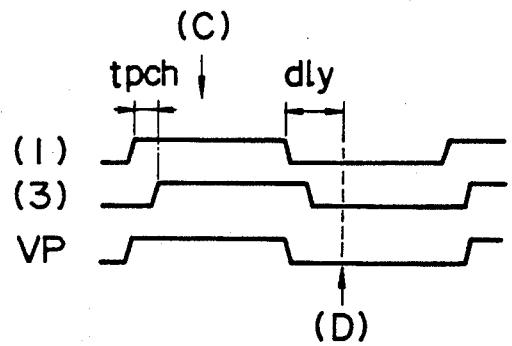
FIG. 7 is an operating waveform chart in the case where latch circuits are provided in the embodiment of FIG. 6.

By the provision of the first latch circuit 17, even if an input for switching the output taps from the tap (1) to the tap (3) is given at the timing indicated by the arrow (C) in an operating waveform chart of FIG. 7, the switching is actually effected at the timing (D) a predetermined time delayed from the inversion of the signal of the output tap (1). Therefore, according to the configuration of FIG. 6, the trouble of production of the spike 16 as shown in FIG. 5 can be prevented. The second latch circuit 18 is provided for preventing the first latch circuit 17 from operating at a turn of the output of the decoder 15, whereby the time for the first latch circuit 17 to stabilize its latch operation is obtained.

Figure 8:
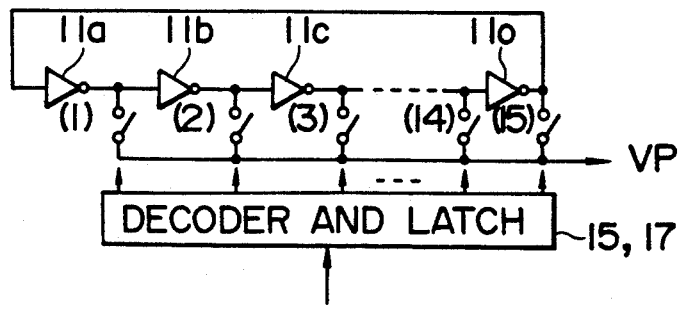
FIG. 8 is a block diagram of a principal portion showing the case where 2-step switching is performed in the first embodiment of the invention shown in FIG. 1
Figure 9:
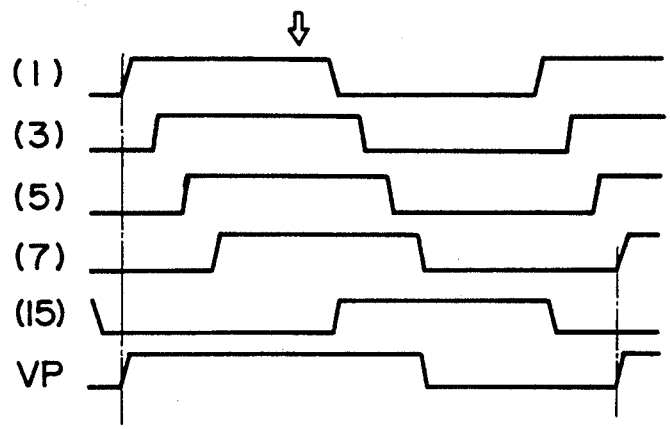
FIG. 9 is an operating waveform chart in the case where 2-step switching is performed in the embodiment shown in FIG. 8.

Below will be described a second embodiment of the present invention referring to FIG. 8 to FIG. 10. Although a method in which the phase pitch is changed one step at a time, i.e., the phase pitch is changed by the amount corresponding to two inverters at a time, was described in the above first embodiment, the phase pitch can be changed two steps or above at a time as shown in a block diagram of the principal portion of FIG. 8 and an operating waveform chart of FIG. 9. FIG. 9 shows a case where switching is made in three steps from the output tap (1) to the output tap (7).

Figure 10:
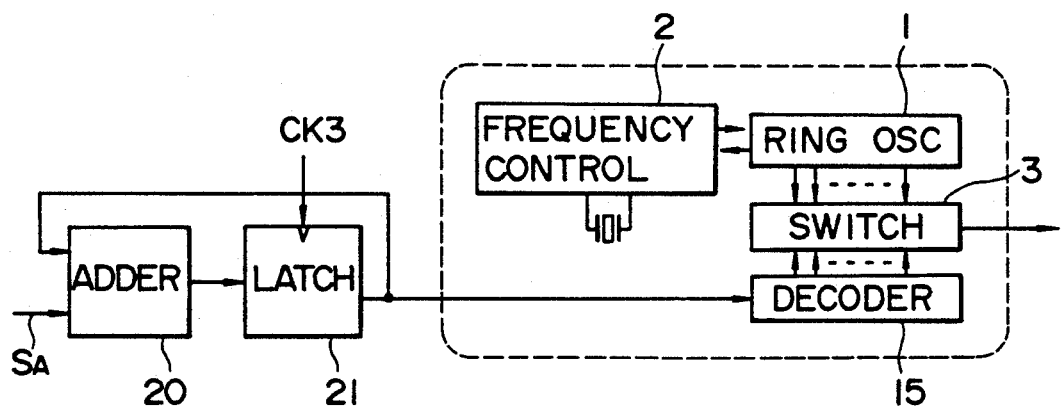
FIG. 10 is a block diagram of a digital VCO of a second embodiment.

In the case where the switching is performed as described above in plural steps, i.e., in two steps or above, it is preferred to use an adder 20 and a latch circuit 21 for structuring the switching control circuit 4 as shown in a block diagram of FIG. 10. The adder 10 is provided with two inputs, one of which is supplied with a fixed value and the other is supplied with a value $S_A$ as an addend. The addend $S_A$ is a value obtained by A/D conversion of an error voltage of the PLL, such as . . . $-1, 0, +1, +2, \ldots$ . In the case of the configuration as shown in FIG. 10, the frequency of the output signal Vp is varied by both the value of the addend $S_A$ and the frequency of a clock CK3 supplied to the latch circuit 21.

In the case of the conventional digital VCO using a programmable divide-by-n counter, the phase pitch could only be reduced to the amount comparable to the period of the clock pulse. Since the digital VCO of the present invention uses a ring oscillator 1 as described above and it is adapted such that the output taps are cyclically switched, the output can be varied in a smaller phase pitch than that of the conventional digital VCO (for example, in 1/15 of the pitch).

Further, by causing the oscillation frequency of the ring oscillator 1 to lock onto the reference frequency of a quartz oscillator or the like, the center frequency can be held correct. Furthermore, since a much wider variable range can be obtained as compared with the generally used VCXO, a non-adjustment system can be easily achieved. Therefore, when PLL circuits are structured with all such circuits as phase comparator and LPF (lag/lead filter) controlled digitally to thereby meet the expected increase in demands for digital signal processing circuits, the present invention is suitable for use as a digitally controllable VCO.

In the present invention structured as described above, it is arranged such that the PLL circuit is structured with the ring oscillator used as the VCO and the taps selected from the output taps of the ring oscillator for taking out the outputs therefrom are cyclically switched to thereby rotate the phase. Therefore, the frequency of the signal taken out of the ring oscillator can be varied finely. Accordingly, it is possible to obtain the output with a much smaller phase pitch than the oscillation frequency of the ring oscillator and to structure a digital VCO having a fine phase pitch without using a higher frequency clock signal. Thus, it is made possible to realize a PLL kept in phase accurately and to obtain an output in accurate phase while using the same design rules and kinds of transistors.

What is claimed is:

1. A digital VCO comprising:
    a ring oscillator including a plurality of inverters connected in series, each inverter having a controllable delay, and a plurality of output taps coupled to respective inverters to derive outputs therefrom;
    a frequency controlling circuit coupled to said ring oscillator for controlling the oscillation frequency of said ring oscillator to be in synchronization with a reference frequency;
    selector switch means for selecting predetermined output taps to be coupled to an output from which a ring oscillator output is derived;
    switching control means coupled to said selector switch means for determining particular output taps to be selected by said selector switch means and controlling said selector switch means to cyclically switch through a sequence of output taps; and
    a latch circuit which latches an output from said switching control means in synchronism with the output of said ring oscillator to delay said selector switch means from switching through the sequence of output taps and thereby prevent production of unwanted pulses in the output of said ring oscillator.

2. A digital VCO comprising:
    a ring oscillator formed of a plurality of inverters connected in series, each inverter being capable of controlling its delay amount;
    a frequency controlling circuit for controlling the oscillation frequency of said ring oscillator to coincide with a reference frequency;
    a selector switch for selecting specified output taps from output taps, each thereof being provided for each of said plurality of inverters, to take out the outputs therefrom; and
    switching control means for controlling the output taps from which the outputs are taken out to be cyclically switched through said selector switch, said switching control means comprising a rate multiplier, a frequency divider, a U/D counter, and a decoder.

3. A digital VCO comprising:
    a ring oscillator formed of a plurality of inverters connected in series, each inverter being capable of controlling its delay amount;
    a frequency controlling circuit for controlling the oscillation frequency of said ring oscillator to coincide with a reference frequency;
    a selector switch for selecting specified output taps from output taps, each thereof being provided for each of said plurality of inverters, to take out the outputs therefrom; and
    switching control means for controlling the output taps from which the outputs are taken out to be cyclically switched through said selector switch; said switching control means comprising an adder, a latch circuit, and a decoder.

* * * * *